(12) United States Patent
Caldwell

(10) Patent No.: US 6,310,611 B1
(45) Date of Patent: Oct. 30, 2001

(54) DIFFERENTIAL TOUCH SENSOR AND CONTROL CIRCUIT THEREFOR

(75) Inventor: David W. Caldwell, Winfield, IL (US)

(73) Assignee: TouchSensor Technologies, LLC, Wheaton, IL (US)

( * ) Notice: Subject to any disclaimer, the term of this patent is extended or adjusted under 35 U.S.C. 154(b) by 0 days.

(21) Appl. No.: 08/986,927

(22) Filed: Dec. 8, 1997

Related U.S. Application Data

(60) Provisional application No. 60/032,318, filed on Dec. 10, 1996.

(51) Int. Cl.[7] .............................. G08B 13/24; G09G 5/00
(52) U.S. Cl. ...................... 345/173; 307/125; 178/18.06
(58) Field of Search .................................. 345/163, 173; 178/18.06; 307/116

(56) References Cited

U.S. PATENT DOCUMENTS

| | | |
|---|---|---|
| 3,200,306 | 8/1965 | Atkins et al. . |
| 3,254,313 | 5/1966 | Atkins et al. . |
| 3,275,897 | 9/1966 | Atkins et al. . |
| 3,909,625 * | 9/1975 | Colglazier et al. .................. 307/116 |
| 4,125,783 * | 11/1978 | Sefton .................................. 307/116 |
| 4,291,303 | 9/1981 | Cutler et al. . |
| 4,379,287 | 4/1983 | Tyler et al. . |
| 4,380,040 | 4/1983 | Posset . |
| 4,394,643 | 7/1983 | Williams . |
| 4,400,758 | 8/1983 | Frame . |
| 4,405,917 | 9/1983 | Chai . |
| 4,405,918 | 9/1983 | Wall et al. . |
| 4,529,968 | 7/1985 | Hilsum et al. . |
| 4,535,254 | 8/1985 | Khatri . |
| 4,550,310 | 10/1985 | Yamaguchi et al. . |
| 4,562,315 | 12/1985 | Aufderheide . |
| 4,584,519 | 4/1986 | Groudis . |
| 4,731,548 | 3/1988 | Ingraham . |
| 4,733,222 | 3/1988 | Evans . |
| 4,740,781 | 4/1988 | Brown . |
| 4,758,735 * | 7/1988 | Ingraham .............................. 307/116 |
| 4,855,550 | 8/1989 | Schultz, Jr. . |
| 5,063,306 * | 11/1991 | Edwards .............................. 307/308 |
| 5,153,572 | 10/1992 | Caldwell et al. . |
| 5,189,417 | 2/1993 | Caldwell et al. . |
| 5,239,152 | 8/1993 | Cakdwell et al. . |
| 5,442,347 | 8/1995 | Vranish . |
| 5,594,222 | 1/1997 | Caldwell . |
| 5,812,057 * | 9/1998 | Hepworth et al. .................... 340/540 |
| 5,861,875 * | 1/1999 | Gerpheide ............................ 345/174 |
| 6,061,050 * | 5/2000 | Allport et al. ........................ 345/173 |

FOREIGN PATENT DOCUMENTS

| | | |
|---|---|---|
| 87 09 630 | 11/1988 | (DE) . |
| 0 066 881 | 12/1982 | (EP) . |
| 0 443 924 A1 | 8/1991 | (EP) . |
| 0 443 924 B1 | 11/1992 | (EP) . |
| WO 96 13098 | 5/1996 | (WO) . |

* cited by examiner

Primary Examiner—Steven Saras
Assistant Examiner—William C. Spencer
(74) Attorney, Agent, or Firm—Jenner & Block, LLC

(57) ABSTRACT

A differential touch sensor apparatus for detecting the presence of an object such as a human appendage, the apparatus having a first electrode, a second electrode positioned proximate to the first electrode, a differential circuit connected to the first and second electrodes, and a pulse or other signal source connected to provide electrical signals that generate an electric field between the first and second electrodes. Introduction of an object near the first electrode affects the electric field between the first and second electrodes, thereby affecting the voltage difference between them. A differential circuit provides an output signal responsive to the difference in voltage between the first and second electrodes. In an alternative embodiment, a strobe electrode is provided proximate to both said first and second electrodes and the pulses or other signals are provided to the strobe electrode to induce an electric field between the strobe electrode and each of the first and second electrodes.

84 Claims, 7 Drawing Sheets

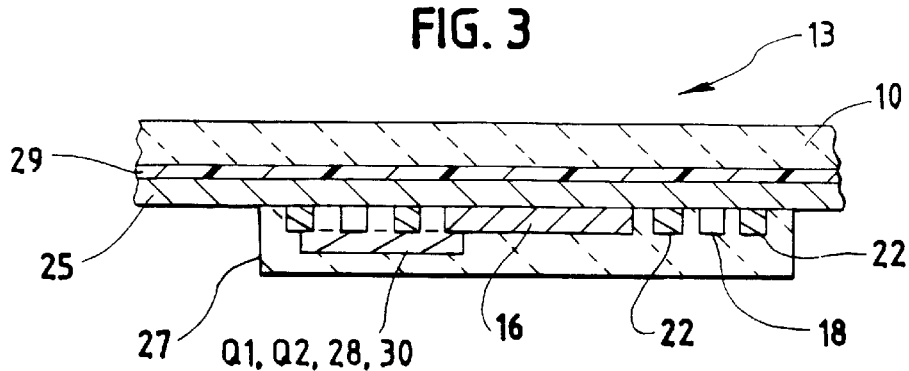
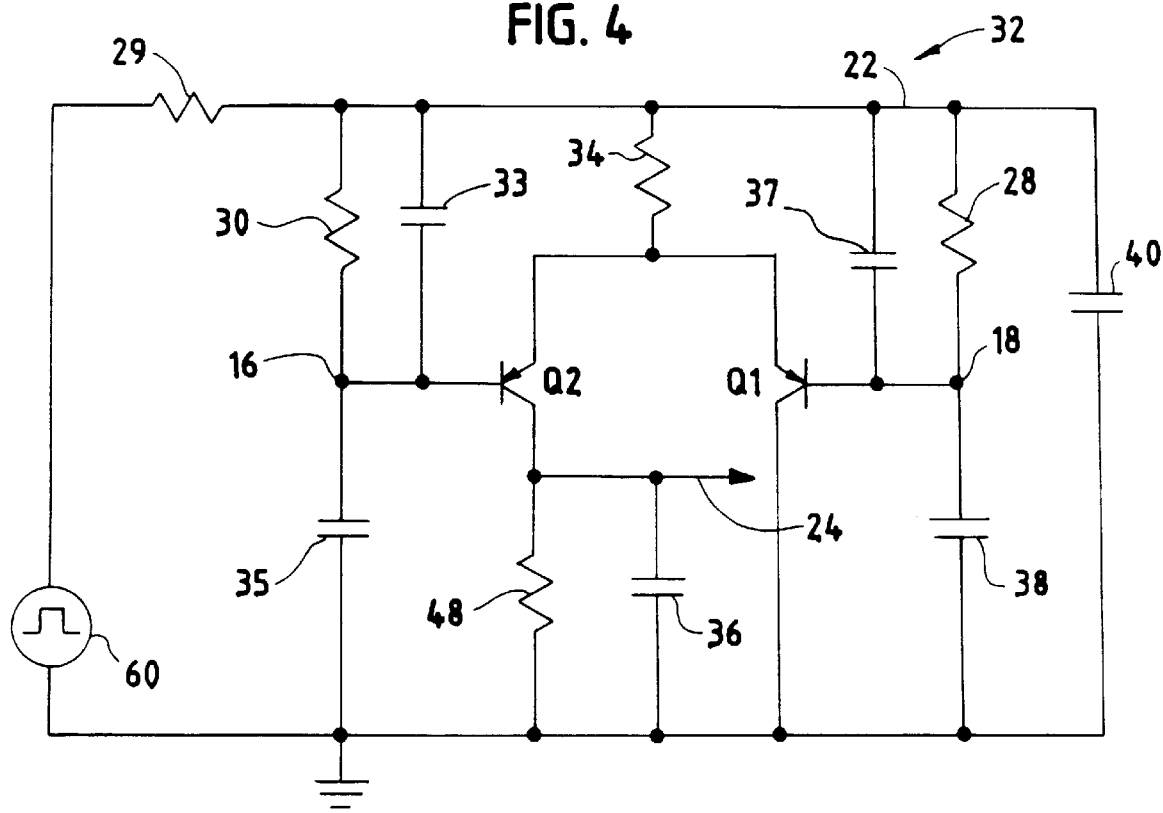

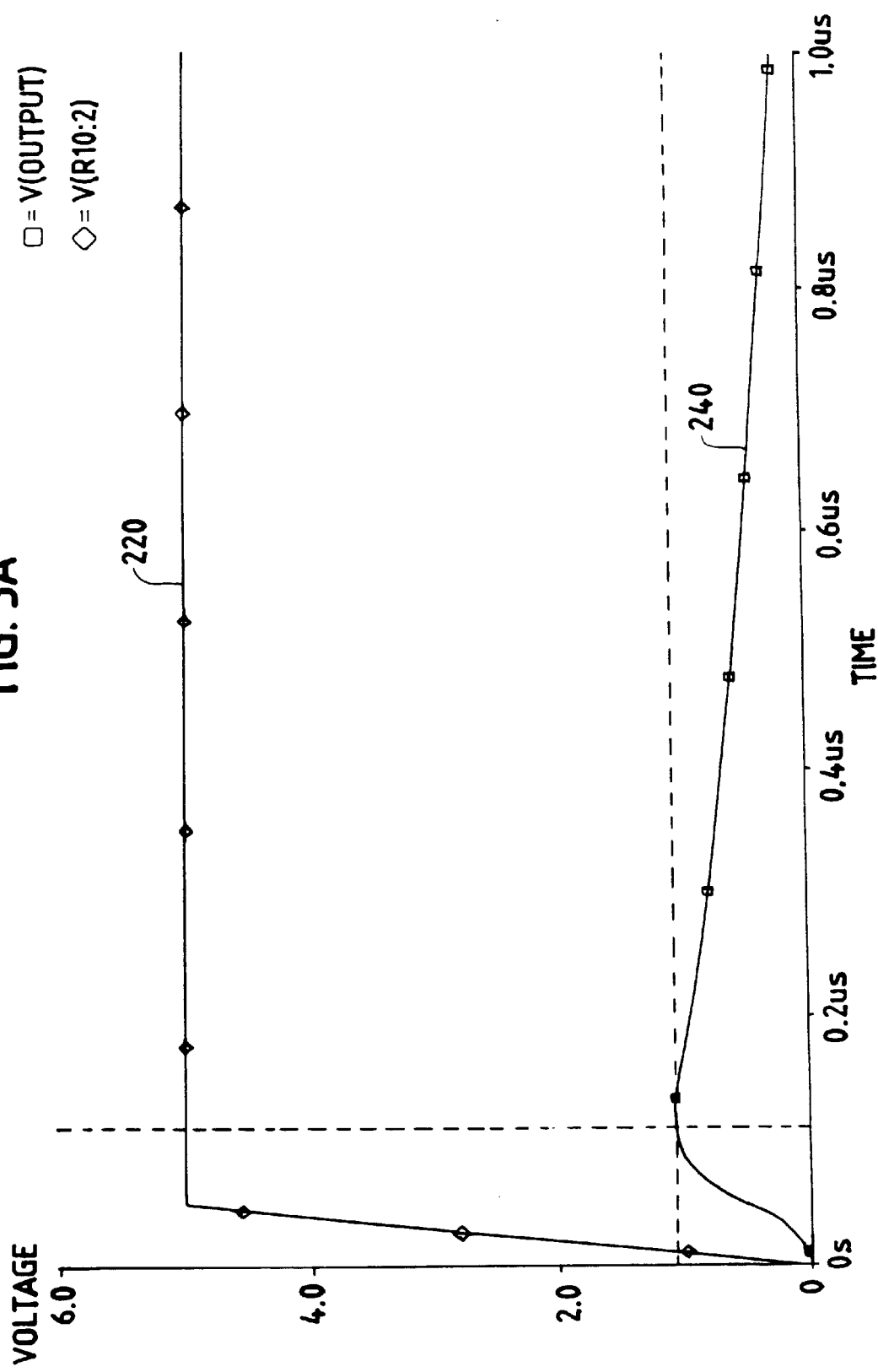

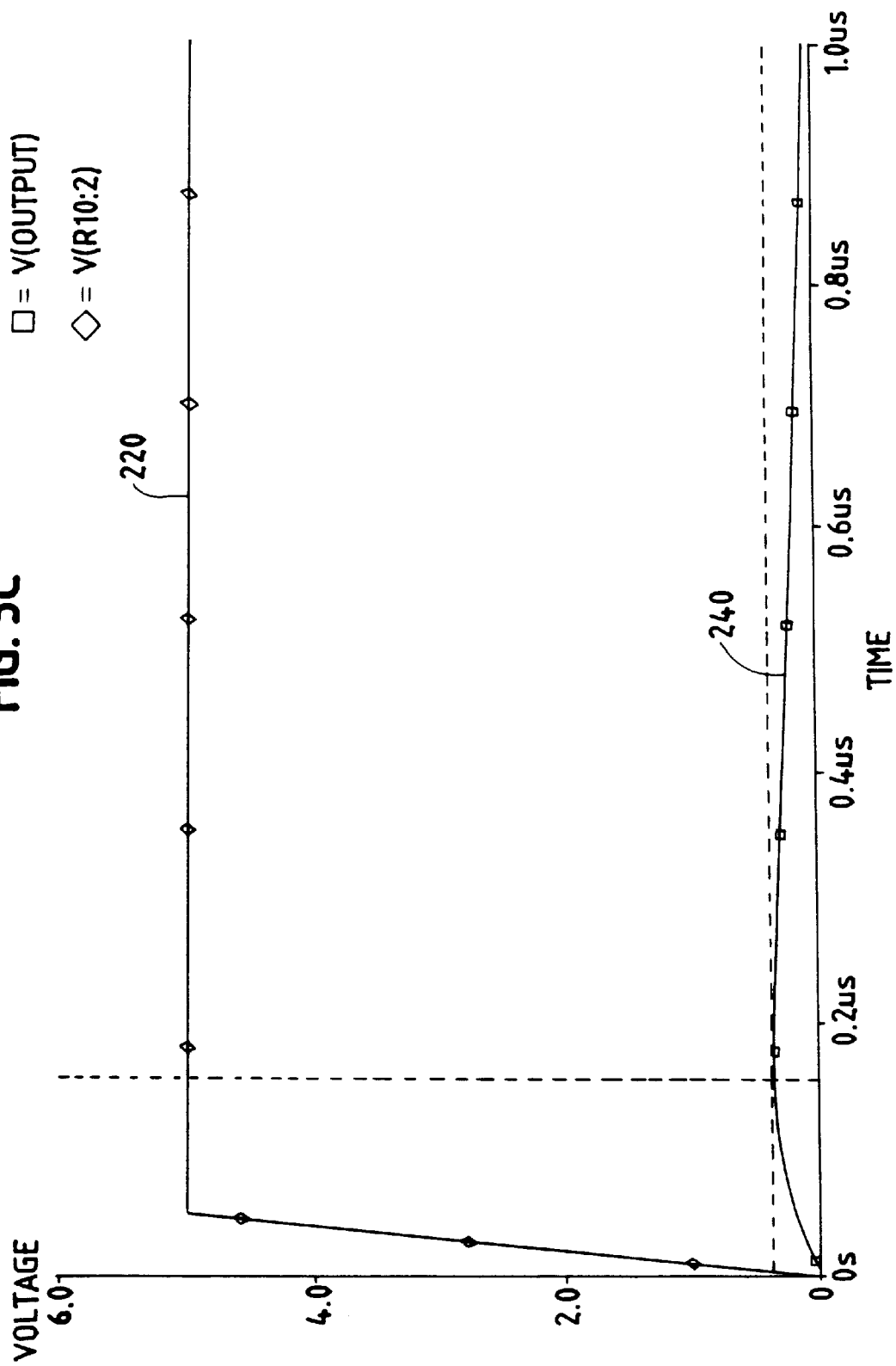

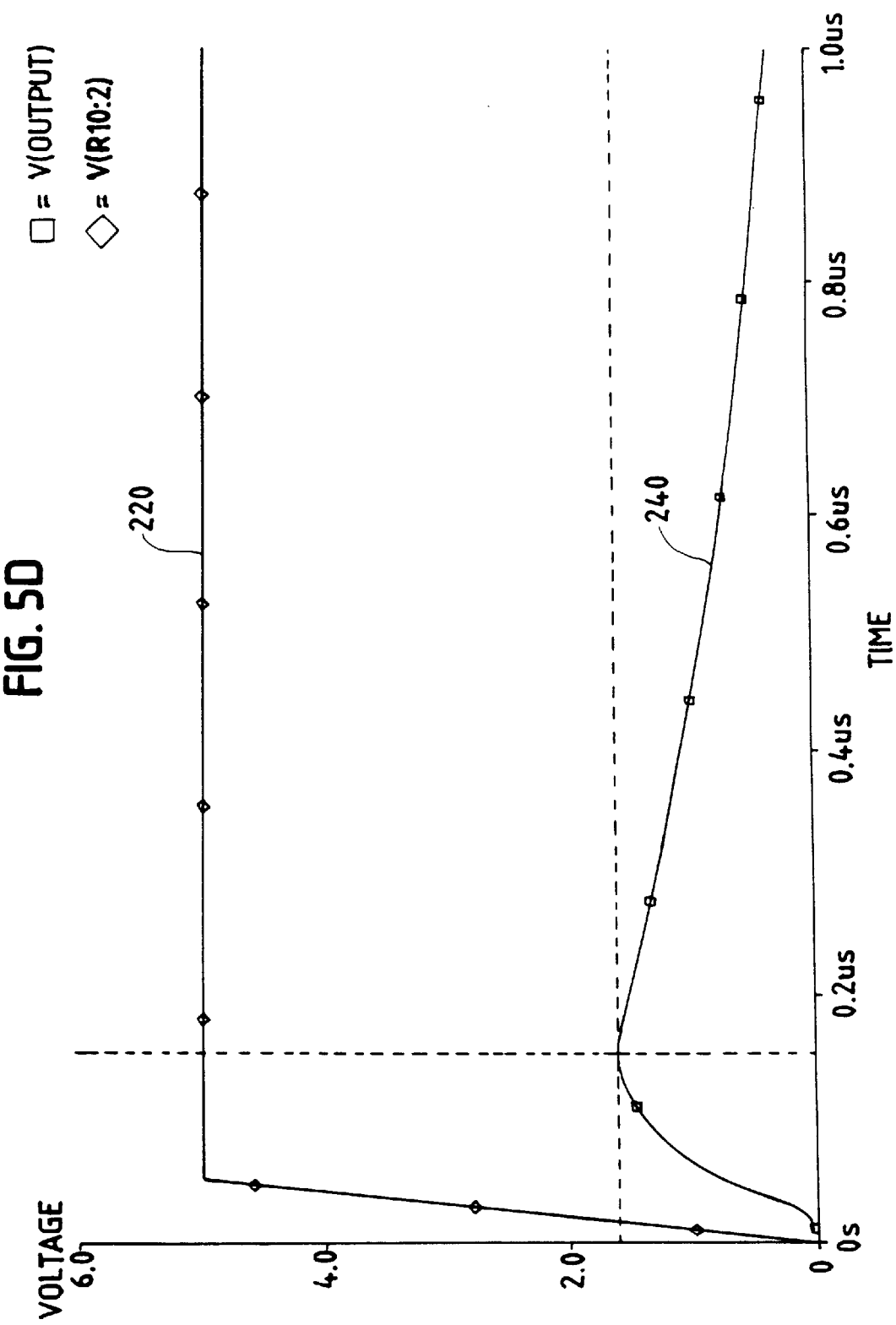

DIFFERENTIAL TOUCH SENSOR AND CONTROL CIRCUIT THEREFOR

This application claims the benefit of U.S. Provisional Application 60/032,318, filed Dec. 10, 1996.

FIELD OF THE INVENTION

The present invention relates to a touch panel system, and more particularly, to touch sensors attached to one side of a substrate for detecting user contact of the opposite side of the substrate.

BACKGROUND OF THE INVENTION

Touch panels are used in various applications to replace conventional mechanical switches: e.g., kitchen stove, microwave ovens, and the like. Unlike mechanical switches, touch panels contain no moving parts to break or wear out. Mechanical switches used with a substrate require some type of opening through the substrate for mounting the switch. These openings, as well as openings in the switch itself, allow dirt, water and other contaminants to pass through the substrate or become trapped within the switch. Certain environments contain a large number of contaminants which can pass through substrate openings, causing electrical shorting or damage to the components behind the substrate. However, touch panels can be formed on a continuous substrate sheet without any openings in the substrate. Also, touch panels are easily cleaned due to the lack of openings and cavities which collect dirt and other contaminants.

Existing touch panel designs provide touch pad electrodes attached to both sides of the substrate; i.e., on both the- "front" surface of the substrate and the "back" surface of the substrate. Typically, a tin antimony oxide (TAO) electrode is attached to the front surface of the substrate and additional electrodes are attached to the back surface. The touch pad is activated when a user contacts the TAO electrode. Such a design exposes the TAO electrode to damage by scratching, cleaning solvents, and abrasive cleaning pads. Furthermore, the TAO electrode adds cost and complexity to the touch panel.

Known touch, panels often use a high impedance design which may cause the touch panel to malfunction when contaminants such as water or other liquids are present on the substrate. This presents a problem in areas where liquids are commonly found, such as a kitchen. Since the pads have a higher impedance than the water, the water acts as a conductor for the electric fields created by the touch pads. Thus, the electric fields follow the path of least resistance; i.e., the water. Also, due to the high impedance design, static electricity can cause the touch panel to malfunction. The static electricity is prevented from quickly dissipating because of the high touch pad impedance.

Existing touch panel designs also suffer from problems associated with crosstalk between adjacent touch pads. The crosstalk occurs when the electric field created by one touch pad interferes with the field created by an adjacent touch pad, resulting in an erroneous activation such as activating the wrong touch pad or activating two pads simultaneously.

Known touch panel designs provide individual pads which are passive. No active components are located in close proximity to the touch pads. Instead, lead lines connect each passive touch pad to the active detection circuitry. The touch pad lead lines have different lengths depending on the location of the touch pad with respect to the detection circuitry. Also, the lead lines have different shapes depending on the routing path of the line. The differences in lead line length and shape cause the signal level on each line to be attenuated to a different level. For example, a long lead line with many corners may attenuate the detection signal significantly more than a short lead line with few corners. Therefore, the signal received by the detection circuitry varies considerably from one pad to the next. Consequently, the detection circuitry must be designed to compensate for large differences in signal level.

Many existing touch panels use a grounding mechanism, such as a grounding ring, in close proximity to each touch pad. These grounding mechanisms represent additional elements which must be positioned and attached near each touch pad, thereby adding complexity to the touch panel. Furthermore, certain grounding mechanisms require a different configuration for each individual touch pad to minimize the difference in signal levels presented to the detection circuitry. Therefore, additional design time is required to design the various grounding mechanisms.

The use of conventional touch panels or touch sensors in stoves, microwave ovens, and the like, places such touch sensors in an environment where they can potentially come into frequent contact with conductive liquids or contaminants. The presence of a conductive liquid on any touch sensor could create a false output thereby causing the control circuit to initiate an output action where none was intended. Such liquids, when in the form of a large puddle or drops, can actually span two or more individual touch sensors. This again leads to the potential for false input signals.

Recent improvements in touch panel design include techniques which lower the input and output impedance of the touch sensor itself, thereby making the sensors highly immune to contaminants and false activations due to external noise sources. U.S. Pat. No. 5,594,222 describes such a technique. Even though this approach has several advantages over the prior art, there are some attributes that may limit its application. For instance, the resulting sensor may be inherently sensitive to temperature variations. As long as the temperature variations at the output are small relative to legitimate signal changes and are small relative to signal variations due to transistor variations, then a single transistor or other amplifying device will be quite satisfactory. However, in applications where there is little dynamic range to allow for compensation by software and where temperature changes are significant relative to legitimate signal changes, another approach would be useful to eliminate or greatly reduce the effects of temperature. Also, even though the low impedance approach of this technique can differentiate between contaminants with some finite amount of impedance and a human touch with some finite amount of impedance, this technique may not be enough to inherently differentiate extremely low levels of impedance. Such examples of this situation would exist when a sensor (i.e., both the inner and outer electrode) is covered with a large amount of contaminants, greatly reducing the impedance of the inner pad. Another example would be where a conductive material such as a metal pan covers an entire singular sensor.

Thus, it would be desirable to provide a touch panel which prevents false signal generation in the presence of highly conductive materials, relatively substantial temperature changes, and other effects common to both the inner and outer electrode and associated circuitry.

SUMMARY OF INVENTION

The present invention greatly improves, if not completely solves, the above mentioned problems by providing for a comparison between two electrodes that make up a touch sensor. The inventive touch sensor has one or more first electrodes and one or more second electrodes coupled to a circuit means for measuring the difference in electrical potential between the first and second electrodes. The first and second electrodes typically would be placed on the same surface of the substrate, opposite the side of the substrate that would be used as the touch surface. The first electrode is spaced proximate to the second electrode such that a comparison can be made between the voltage on the first electrode and the second electrode when affected by a touch input. The differential measuring circuit will provide for the rejection of common mode signals such as temperature, electrical noise, power supply variations, and other inputs that would tend to affect both electrodes equally.

The inventive touch pad can be used in place of existing touch pads or to replace conventional switches. The touch pad is activated when a user contacts or approaches near to the substrate with a human appendage, such as a fingertip. The touch pad can be used, for example, to turn a device on or off, adjust temperature, set a clock or timer, or any other function performed by a conventional switch. In addition to improving and solving problems associated with existing touch pad designs, the present invention also is useful in applications which presently use membrane switches. The touch pad of the present invention is well suited for use in environments where temperature variations are extreme, where substantial amounts of contaminants are present or where metal objects may be placed on or over the touch pad.

In the preferred form, a strobe electrode is connected through a first resistor to a first electrode and through a second resistor to a second electrode. An electric field is generated at each electrode in response to a strobe signal being applied to the strobe electrode. An electric potential is developed at each electrode. Two transistors are arranged in a differential measuring circuit which is connected to the first and second electrodes for measuring the difference in voltage between the first and second electrodes. A sense line is attached to the output of the differential measuring circuit, which in the preferred embodiment carries a detection signal to a peak detector circuit. The output of the differential measuring circuit is altered when the substrate is touched by a user.

In the preferred form, two matched transistors are configured as a differential pair, each located in close proximity to the touch pad. The transistors work together to amplify the differential input signal, to buffer the touch pad from the effects of strobe and sense traces, and to reduce the output impedance of the touch pad. Also, by using matched transistors, the output of the differential circuit will change little with temperature variations.

The inner and outer electrodes are connected to separate inputs to the differential circuit such that when a first electrode is affected more by the induced electric field than the second electrode, the differential circuit will provide a higher output voltage level. Also, in the preferred embodiment the circuit will generate a lower output when the second electrode is affected more than the first electrode by the electric field. When both electrodes generate equal or similar responses, the output of the differential circuit will change little. These conditions will be created, for example, when a fingertip substantially covers the first electrode but not the second electrode. This will generate a higher output signal. Another condition is created when contaminates substantially cover the second (outer) electrode but not the first (inner) electrode. This will generate a lower level output signal. Another condition would be when a metal pan covers both of the first and second electrodes. Given this condition, in the preferred embodiment, the response of the two electrodes will be substantially equal and, therefore, the output of the differential measuring circuit will change little from the previous no-touch condition.

BRIEF DESCRIPTION OF THE DRAWINGS

The various features, advantages and other uses of the present invention will become more apparent by referring to the following detailed description and drawings in which:

FIG. 3 is a cross-sectional view, similar to FIG. 2, but showing an alternate mounting of the active components to the substrate;

FIG. 4 is an electrical schematic representation of the touch pad shown in FIGS. 1 and 2;

FIGS. 5A, 5B, 5C and 5D are waveforms of the sense output under various input stimuli;

Similar indicia numbers in FIGS. 1, 2, 3, 4, and 7 indicate similar elements.

DESCRIPTION OF THE PREFERRED EMBODIMENTS

Figure 1:
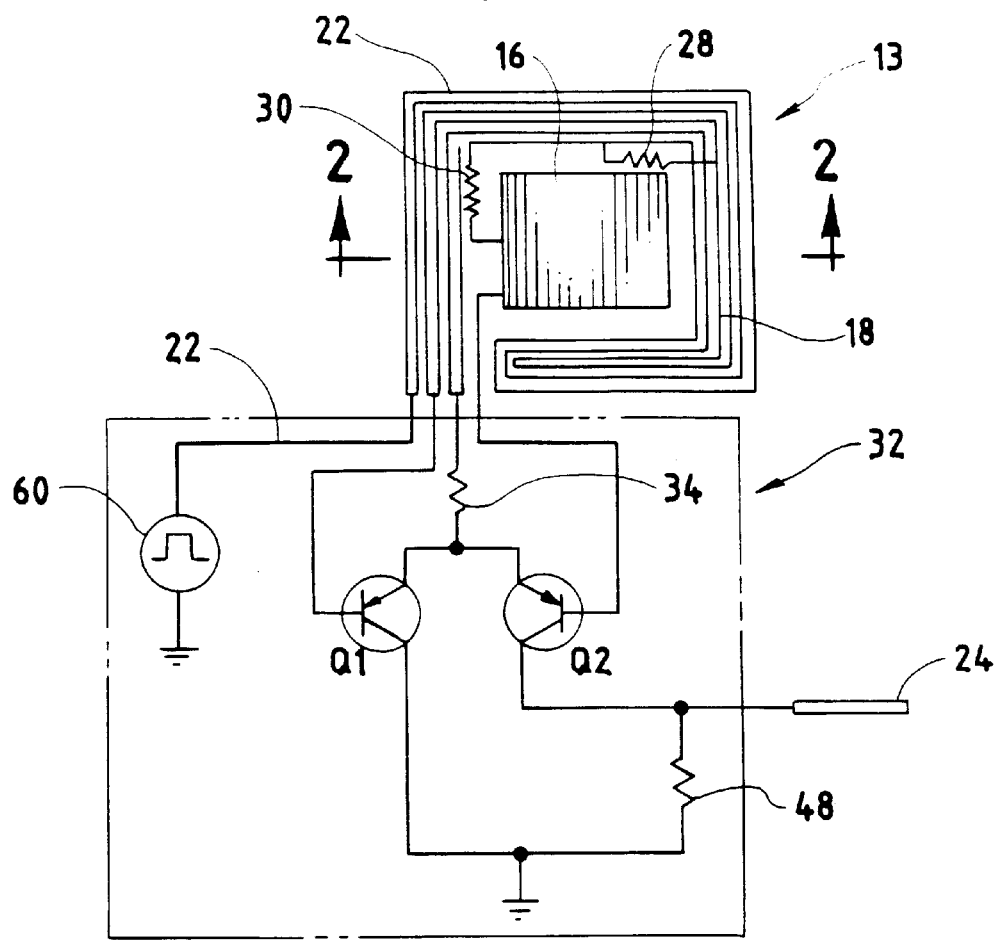
FIG. 1 illustrates an inventive touch pad as viewed from the back surface of the substrate.
Figure 2:
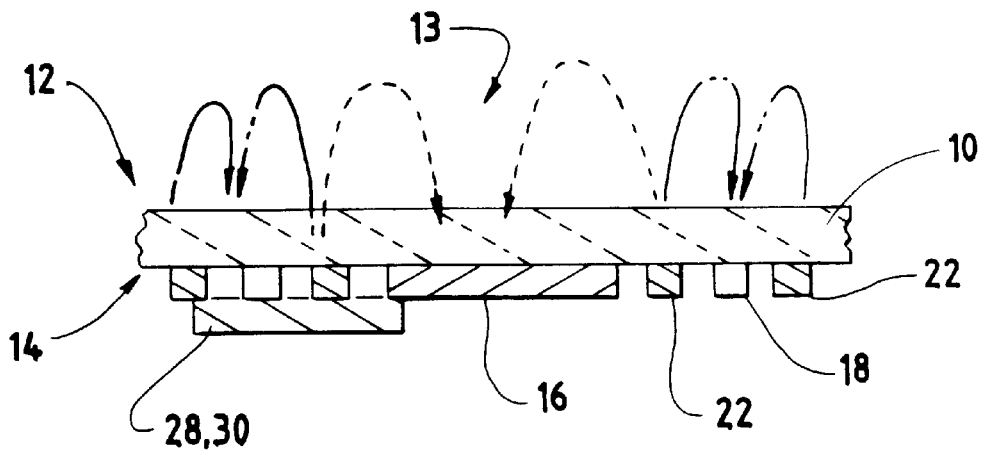
FIG. 2 is a cross-sectional view generally taken along line 2—2 in FIG. 1.

Referring to FIGS. 1 and 2, a single touch pad 13 is shown attached to a dielectric substrate 10. It should be understood that many, if not most, applications will include multiple touch pads and related circuitry on the substrate.

Substrate 10 can be manufactured from any type of dielectric material, such as glass, ceramic, plastic or similar materials. In the preferred embodiment, substrate 10 is manufactured from glass and has a uniform thickness of approximately 3 mm. The thickness of substrate 10 varies with the particular application such that a thicker substrate is used where additional strength is required. If substrate 10 is manufactured from glass, typical substrates can be as thin as approximately 1.1 mm and as thick as approximately 5 mm. If substrate 10 is manufactured from plastic, the substrate can be less than 1 mm thick, similar to the material used in plastic membrane switches.

Substrate 10 has a front surface 12 and an opposite back surface 14. A user activates the touch pad 13 by touching front surface 12 of substrate 10, providing the necessary stimuli.

The touch pad 13 includes a first, conductive or inner electrode pad 16 and a second, conductive or outer electrode 18 which substantially surrounds the first electrode. A space is located between first electrode 16 and second electrode 18. Preferably, first electrode 16 has dimensions such that the electrode may be covered by a user's fingertip or other human appendage when the front surface is touched.

In the preferred embodiment, first electrode 16 is square and second electrode 18 has a square shape which conforms to the shape of the first electrode 16. However, it will be understood that various geometric shapes may also be used for the first electrode 16 including, but not limited to, rectangles, trapezoids, circles, ellipses, triangles, hexagons, and octagons. Regardless of the shape of first electrode 16, second electrode 18 at least partially surrounds the first electrode 16 in a spaced apart relationship.

It may be recognized that even though the pad geometry in FIG. 1 is one way to arrange the electrode structure, there are many other shapes and sizes that would work also, depending on the application and size of the appendage. One example could be an arrangement where a hand might be the appendage of interest instead of a finger. In this case, the spacing between the two electrodes could be spaced farther apart and the two electrodes would be much larger.

Figure 7:
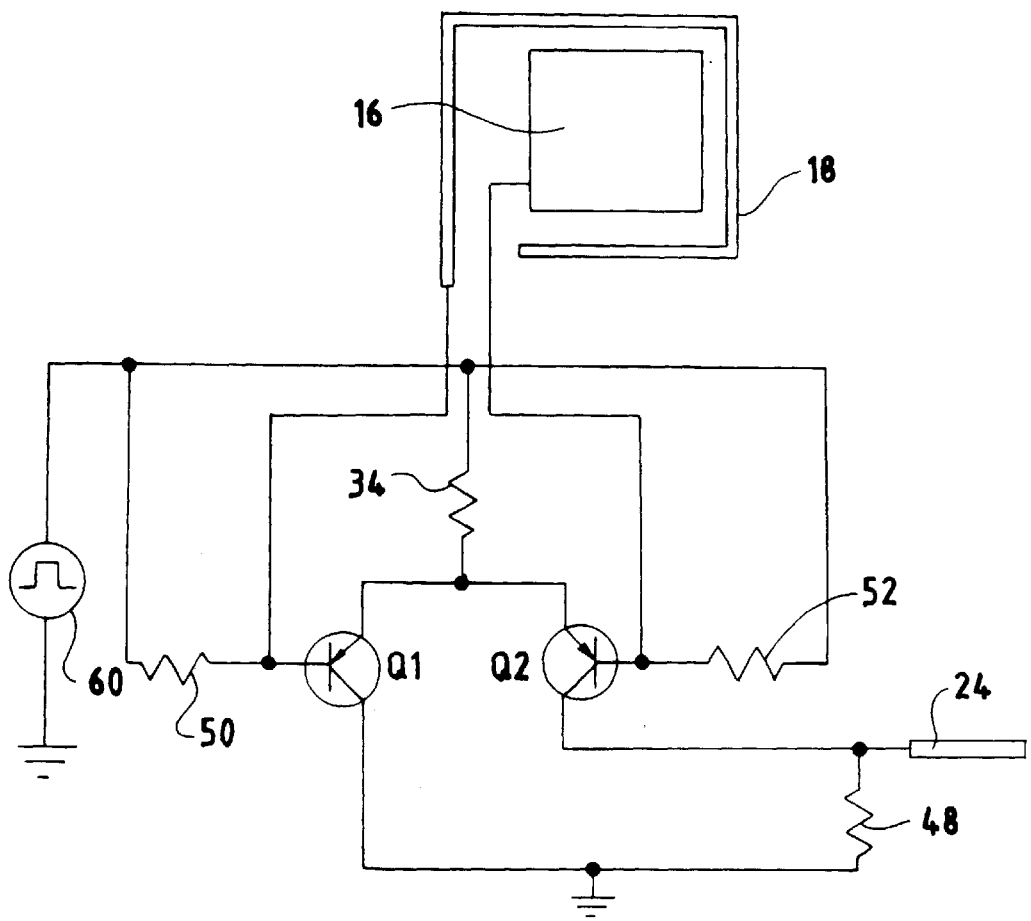
FIG. 7 is a view, similar to FIG. 1, but of an alternate embodiment of the inventive touch pad.

Similarly, it may be recognized that even though the pad geometry in FIGS. 1 and 7 each show specific ways to arrange the electrode structure, there are many other shapes and sizes that would work here also, depending on the application and size of the appendage. One example would be where the two electrodes are spaced farther apart and the two electrodes are larger.

Preferably, first electrode 16 is a solid conductor. However, first electrode 16 may also have a plurality of apertures or may have a mesh or grid pattern.

In the preferred embodiment, a third electrode, strobe electrode 22 is provided, as Shown in FIG. 1. The strobe electrode 22 is a thin conductor formed on the substrate 10. The strobe electrode 22 is spaced across from the second electrode 18. Preferably, the strobe electrode 22 is spaced from both sides of the second electrode 18 as shown in FIG. 1. The strobe electrode 22 is also adjacent the first electrode 16. In this manner, one portion of the strobe electrode 22 is spaced between the second electrode 18 and the first electrode 16 such that the single strobe electrode 22 acts as a strobe line for both the first electrode 16 and the second electrode 18, as seen in FIG. 1.

As shown in FIG. 1 the strobe electrode or line 22 is connected to a voltage source 60.

Figure 6:
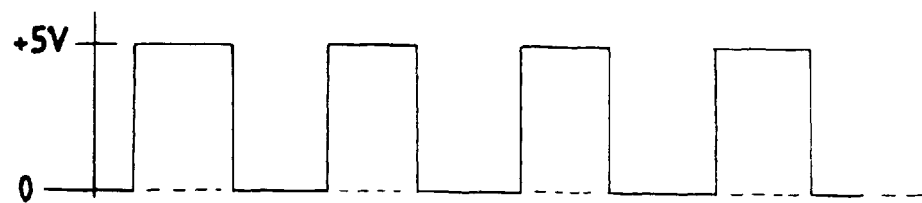
FIG. 6 illustrates the strobe signal waveform.

Strobe line 22 carries a strobe signal such as, for example, a square wave in the preferred embodiment, (shown in FIG. 6) from a source 60. In the square preferred embodiment, the wave oscillates between 0 and +5 volts at a frequency between 25 khz and 50 khz. Alternatively, the strobe signal may have a frequency less than 25 khz or greater than 50 khz, depending on the detection circuitry used. Furthermore, the strobe signal may oscillate between 0 and +3 volts, 0 and +12 volts, 0 and +24 volts, −5 volts and +5 volts, or any other voltage range, depending on the voltage readily available from the device being controlled.

Preferably, the strobe signal has a rise time of approximately 7 nsec. However, rise times up to 110 nsec or even larger may also be used. Faster rise times, such as 7 nsec, provide lower input impedances and may be preferred. The strobe signal creates an electric field at the touch pad, as described hereinafter.

The strobe signal has a sharp rising edge (shown in FIG. 6) which creates a difference in the electrical potential between the strobe line 22 and each of second electrode 18 and first electrode 16. This difference in potential between electrodes 15, 18 and 22 creates an arc-shaped electric field between the electrodes, as shown by the dashed lines in FIG. 2. The electric field extends past front surface 12 and through substrate 10. Although not shown in FIG. 2, the electric field between electrodes 16, 18 and 22 follows a similar arc-shaped path away from the back surface 14 of the substrate 10. This path is almost a mirror image of the dashed lines shown in FIG. 2, extending downwardly rather than upwardly.

As shown in FIG. 2, the electric fields created are in opposition to one another. For example, the field paths shown in FIG. 2 originate from strobe electrode 22, at opposite sides of the first electrode 16, and from strobe electrode 22 to second electrode 18.

Referring again to FIG. 1, a sense or output line 24 is attached to substrate 10 connected to the output of differential circuit 32, which is described hereinafter. Sense line 24 carries a detection or operate signal from the touch pad 13 to activate suitable detection or control circuitry as described in detail in my U.S. Pat. No. 5,594,222 which issued Jan. 14, 1997, the contents of which is incorporated herein.

As shown in FIGS. 1,2 and 4, surface mount components are electrically connected to the touch pad 13. The surface mount components include resistor 28 connected between the strobe electrode 22 and the second electrode 18, and resistor 30 connected between the first electrode 16 and the strobe electrode 22. The resistors 28 and 30 may have a value of 2.2 K ohms, as shown in the preferred embodiment, thereby providing a relatively low discharge input impedance for the touch pad 13.

The differential circuit denoted generally by reference number 32 is also connected to the electrodes 16,18 and 22. The differential circuit 32 includes two transistors Q1 and Q2 arranged in a differential pair with the emitters of both transistors Q1 and Q2 connected to strobe electrode 22 through resistor 34.

The base of transistor Q1 is connected at second electrode 18 to resistor 28, with its collector connected to ground. The base of transistor Q2 is connected to resistor 30 via first electrode 18. The collector of transistor Q2 is connected to the sense line 24 and to ground through resistor 48.

Preferably, each transistor Q1 and Q2 is a PNP transistor, such as transistor model number MPS3906. Alternately, a NPN transistor, MOSFET, or any other active, triggerable electrical component may be used in place of a PNP transistor.

FIG. 4 also schematically illustrates stray, parasitic and other capacitance coupling between the various electrodes 16,18 and 22. Capacitor 37 represents capacitive coupling between the strobe electrode 22 and the second electrode 18. Capacitor 33 represents capacitive coupling between the strobe electrode 22 and the first electrode 16. Capacitor 35 represents first electrode field disturbance (i.e., modeled as capacitive coupling between the first electrode 16 and the ground). Capacitor 36 represents stray sense line capacitance. Capacitor 38 represents second electrode 18 field disturbance. Capacitor 40 represents stray strobe line capacitance. Resistor 29 represents the resistance of strobe electrode 22. Resistor 30 in the present embodiment serves to bias transistor Q2 on during the leading edge of the strobe pulses and forms a discharge path for capacitors 33 and 35. Similarly resistor 28 forms a discharge path for capacitor 37 and 38 and biases transistor Q1 on during the leading edge of the strobe pulses.

The differential circuit 32 operates in such a way that transistors Q1 and Q2 act as a differential pair. Common emitter resistor 34 serves to generate negative feedback which will generate the differential action of the sensor circuit. If the base of transistor Q2 is biased higher than the base of Q1, more current will flow through the collector of Q2 thereby generating an increase of voltage across resistor 48. If the base of transistor Q1 is biased higher than the base of transistor Q2, then the majority of the emitter current will flow through the collector of transistor Q1 thereby leaving less current to flow through the collector of transistor Q2 generating a decrease of voltage across resistor 48. If the bias applied to the base of transistor Q1 is increased and the bias applied to the base of transistor Q2 is also increased to a voltage equal to the bias on the base on the base of transistor Q1, then the differential circuit is balanced, and there is no appreciable increase in the collector current of Q2 and the voltage change across resistor 48 will be small, if any.

Figure 5B:
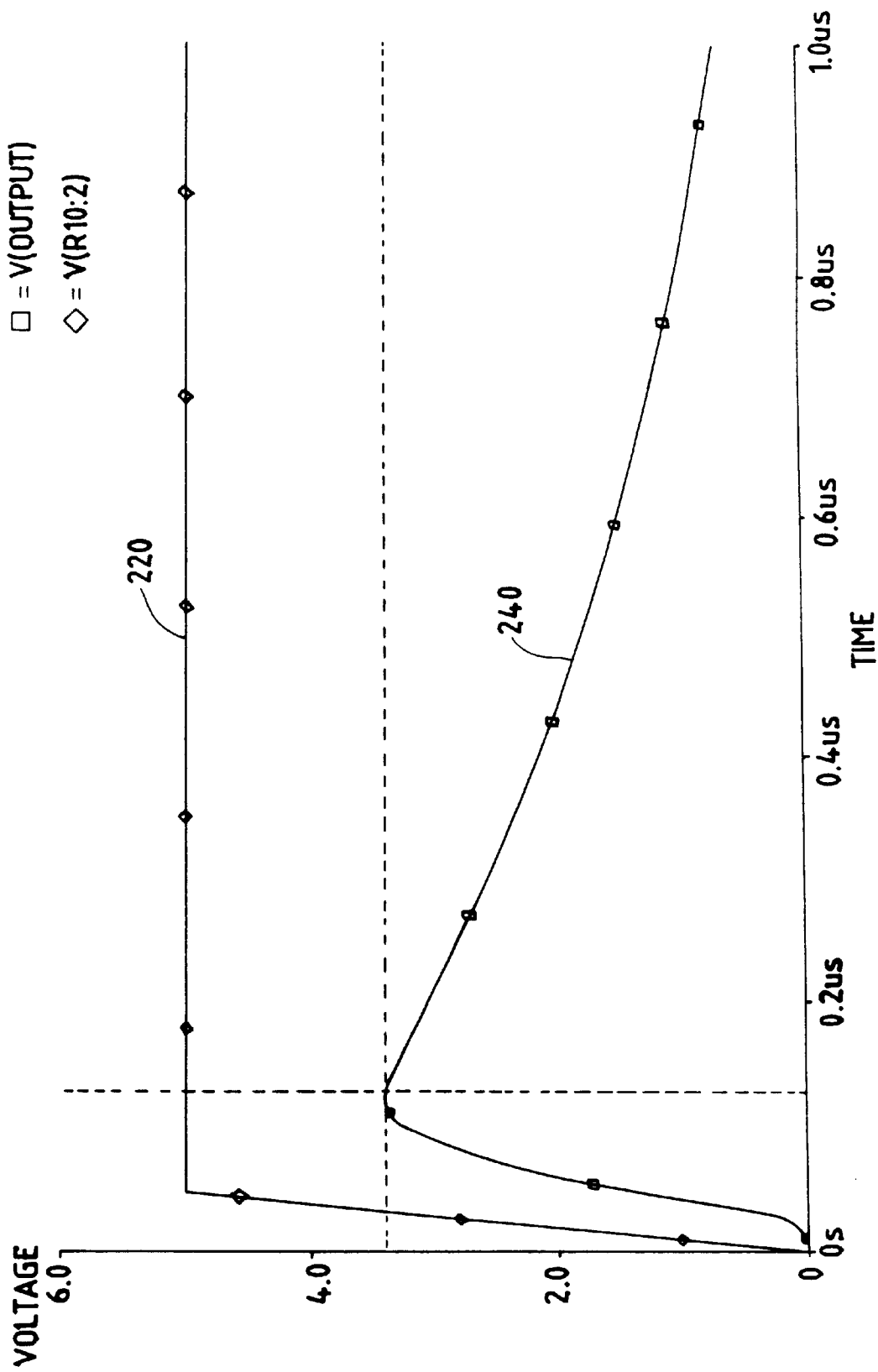

The differential circuit 32 provides several advantages with respect to the operation of the touch sensor 13. This operation can be seen in FIGS. 5A–5D, which depict output voltage on sense line 24 in response to various stimuli or lack of stimuli applied to the first and second electrodes 16 and 18. As shown in FIG. 5A where there is no first or second electrode stimuli, the signal 220 on strobes line 22 will rise from 0 volts to a maximum of approximately 5.0 volts. Although there is a relatively small output voltage 240 on the sense line 24, essentially due to the slight difference in the biasing of the transistors Q1 and Q2, the output voltage on sense line 24 is at a minimal steady state amount.

As shown in FIG. 5B, with a stimulus applied to the first electrode 16 (i.e., a finger tip placed on front surface 12 in the area of first electrode 16), and no stimulus to the second electrode 18, the output voltage on sense line 24 rises to a maximum of over 3.0 V, which is appreciably greater than the steady state amount, and then falls off exponentially. In FIG. 5C, a stimulus applied only to the second electrode 18 results in a voltage on sense line 24 which is less than the steady state voltage. Finally, as shown in FIG. 5D, when stimuli are applied to both first and second electrodes 16 and 18, the output voltage is close to the steady state voltage.

The differential circuit 32 acts to generate output proportional to a difference between the stimuli applied to first and second electrodes 16 and 18. Thus, the output 24 is substantially more sensitive to a difference in stimuli applied to first and second electrodes 16 and 18 then to the magnitude of the stimuli. If substantial amounts of contaminants or conductive materials are placed over both the first and second electrodes 16 and 18, there will be various responses from the touch sensor 10 depending on the nature of the contaminates, with higher conductivity contaminants tending to generate lowered responses. Such a substantial amount of contaminate need only be as large as the enclosed area of the second electrode 18. This arrangement makes the touch sensor 10 highly immune to false triggering due to substantial contamination or conductive material at a localized area while allowing responses to small differences between the first and second electrodes.

Further, differential circuit 32 minimizes drift due to temperature changes in the active components since the bias of both transistors Q1 and Q2 will change together such that the current through resistor 48 will not change substantially. Finally, changes relating to power supply, input signals, component drift electrical noise, etc., common to both of electrodes 16 and 18 and transistors Q1 and Q2 will tend not to affect the output of differential circuit 32.

In addition to differential circuit 32, other methods may be used to process the differential signal associated with the first and second electrodes 16 and 18. Current differencing techniques and mirrors typically used in Norton amplifiers, MOS type transistors, and voltage input operational amplifiers are examples of the types of circuits that could be used.

With reference to an alternative embodiment shown in FIG. 3, electrodes 16,18, and 22, and sense line 24 are attached to a flexible carrier 25 manufactured from a polyester material such as Consolidated Graphics No. HS-500, Type 561, Level 2, 0.005 inches thick. Electrodes 16,18, and 22, and sense line 24 are formed using a conductive silver ink, such as Acheson No. 427 SS, 0.5 mills thick. The active components Q1 and Q2 are then attached to the electrodes and lines. A dielectric layer 27 is placed over the electrodes and lines to protect the conducting surfaces. Preferably the dielectric 27 is Acheson No. ML25089, 1.5 mills thick. The flexible carrier 25 is then bonded to substrate 10 using an adhesive 29 such as 3M No. 457. The flexible carrier 25 can be curved and twisted to conform to the shape of substrate 10.

Alternatively, with reference to FIG. 2, electrodes 16, 18, and 22, and sense line 24 can be attached directly to substrate 10. The active components are then attached to electrodes 16,18 and 22, and to sense line 24.

In operation, the touch pad 13 is activated when a user applies stimuli by contacting or approaching substrate 10. The touch pad 13 will sense contact by a fingertip or other appendage which causes a sufficient disruption of the electric field potential between electrodes 16 and 18.

The base current of transistors Q1 and Q2 is determined by the equation $I_b = C(dV/dT)$ where $I_b$ is the base current, C is the capacitance of the touch pad field, and dV/dT is the change in voltage with respect to time. The change in voltage with respect to time is created by the change in voltage level of the oscillating strobe signal. When a user contacts the touch pad 13 formed by electrodes 16, 18 and 22, the field capacitance of capacitor 33 is reduced while the field capacitance of capacitor 35 is increased. Due to the relative close proximity of electrode 18 on back surface 14 to the user contact on front surface 12 in the preferred embodiment, there will be an increase of field capacitance on capacitor 38 also, though not as great as the field capacitance of capacitor 35.

In the preferred embodiment, transistor Q2 amplifies and buffers the detection signal in close proximity to the touch pad 13. This reduces the difference in signal level between touch pads caused by different lead lengths and lead routing paths. By providing a more uniform detection signal level, greater amplification is possible while maintaining the signal level between, for example, 0 and +5 volts.

In the embodiment shown in FIG. 7, the strobe electrode 22 is eliminated. The bases of transistors Q1 and Q2 are still connected to the second and first electrodes 18 and 16, respectively. The strobe signal is applied directly to the bases of Q1 and Q2 through resistors 50 and 52. Q1 is biased on by the resistor 50 and the field capacitance developed by electrode 18. In a similar manner, Q2 is biased on by the resistor 52 and the field capacitance developed by the electrode 16. A field potential difference generated by the transient voltages applied to electrodes 16 and 18 is developed. The potential difference will cause the bias on Q1 and the bias on Q2 to differ proportionally with the field potential difference associated with electrodes 18 and 16. This embodiment provides less isolation between first and second electrodes 16 and 18 as compared to the circuit of FIG. 1. Even with less isolation, there are many applications where the level of performance provided by this embodiment is adequate. The benefits derived from the insensitivity of the differential circuit arrangement to common mode influences, such as the effects associated with the application environment, etc., mentioned above, is preserved in this alternative embodiment of FIG. 7.

While only two embodiments of the present invention have been shown, it will be obvious to those skilled in the art that numerous modifications may be made without departing from the spirit of the claims appended hereto.

What is claimed is:

1. A sensor apparatus for generating a control signal on a sense line, said apparatus comprising:

at least one first electrode:
    at least one second electrode positioned in proximity to said first electrode;
    a differential measuring circuit in close proximity to said first and second electrodes, said differential measuring circuit having first and second input nodes connected to said first and second electrodes, respectively, and an output node connected to the sense line;
    a signal source for providing electrical signals to said first and second electrodes;
    wherein an electric field is generated between said first and said second electrodes in response to the signals provided to at least one of said first and second electrodes by said signal source;
    wherein said first and second electrodes are arranged such that the electric field is affected by the presence of a stimulus in proximity to at least one of said first and second electrodes;
    wherein said differential measuring circuit generates a control signal on the sense line related to the difference in electrical potential between said first and second electrodes related to the electric field; and
    wherein the output voltage of the control signal produced by the differential measuring circuit on the sense line rises to a maximum only when a stimulus is applied to the electric field affecting the first electrode and a lesser stimulus is applied to the electric field affecting the second electrode.

2. A sensor apparatus for generating a control signal on a sense line, said apparatus comprising:
    at least one first electrode;
    at least one second electrode positioned in proximity to said first electrode;
    a strobe electrode positioned in proximity to said first and second electrodes;
    a differential measuring circuit in close proximity to said first and second electrodes, said differential measuring circuit having first and second input nodes connected to said first and second electrodes, respectively, and an output node connected to the sense line;
    a signal source for providing electrical signals to said strobe electrode;
    wherein an electric field is generated between said first and second electrodes in response to the signals provided to said strobe electrode by said signal source;
    wherein said first and second electrodes are arranged such that the electric field is affected by the presence of a stimulus in proximity to at least one of said first and second electrodes;
    wherein said differential measuring circuit generates a control signal on the sense line related to the difference in electrical potential between said first and second electrodes related to the electric field; and
    wherein the output voltage of the control signal produced by the differential measuring circuit on the sense line rises to a maximum only when a stimulus is applied to the electric field affecting the first electrode and a lesser stimulus is applied to the electric field affecting the second electrode.

3. The apparatus as claimed in claim 1 or 2 wherein the electrical signals provided by said signal source are square wave pulses.

4. The apparatus as claimed in claim 1 or 2 wherein said circuit further comprises first and second active elements.

5. The apparatus as claimed in claim 4 wherein said first and second active elements further comprise first and second transistors arranged as a differential amplifier.

6. The apparatus as claimed in claim 5 wherein the emitters of both said first and second transistors are connected to said signal source through a resistor such that said resistor provides negative feedback.

7. The apparatus as claimed in claim 1 or 2 further comprising an active element associated with each of said first and second electrodes.

8. The apparatus as claimed in claim 2 further comprising a first resistor connected between said first electrode and said strobe electrode and a second resistor connected between said second electrode and said strobe electrode.

9. The apparatus as claimed in claim 8 wherein each of said first and second resistors has a value such that said apparatus has a relatively low input impedance compared to the impedance of a contaminant in proximity to at least one of said first and second electrodes.

10. The apparatus as claimed in claim 8 wherein said circuit further comprises first and second active elements and said first and second resistors bias said first and second active elements, respectively, to an on state during a leading edge of at least one of said signals from said signal source.

11. The apparatus as claimed in claim 1 or 2 wherein said first and second electrodes are mounted on a substrate comprising a dielectric material.

12. The apparatus of claim 11 wherein said circuit also is mounted on said substrate.

13. The apparatus as claimed in claim 1 or 2 wherein said circuit is mounted on a flexible material.

14. The apparatus as claimed in claim 1 or 2 wherein said second electrode substantially surrounds said first electrode.

15. Apparatus as claimed in claim 1 or 2 wherein said first electrode is dimensioned such that said electrode may be substantially overlayed by a human appendage.

16. The apparatus as claimed in claim 1 or 2 wherein the configuration of said second electrode substantially conforms to the configuration of said first electrode and is spaced away from said first electrode.

17. The apparatus as claimed in claim 2 wherein said strobe electrode is located substantially between said first and second electrodes.

18. The apparatus as claimed in claim 1 further comprising a first resistor and a second resistor connected between said signal source and the first and second input nodes, respectively, of said differential measuring circuit.

19. The apparatus as claimed in claim 18 wherein said circuit further comprises first and second active elements and said first and second resistors bias said first and second active elements, respectively, to an on state during a leading edge of at least one of said signals from said signal source.

20. The apparatus as claimed in claim 1 or 2 wherein in response to a lack of a stimulus to the electric field affecting either of said first and second electrodes, the voltage of the control signal produced by said circuit on the sense line is at a minimum.

21. The apparatus as claimed in claim 1 or 2 wherein in response to application of a stimulus to the electric field affecting primarily said second electrode, the voltage of the control signal produced by said circuit on the sense line is less than when no stimulus to the electric field is affecting either said first or second electrode.

22. The apparatus as claimed in claim 1 or 2 wherein in response to the application of a stimulus to the electric field having a substantially equal effect on both said first and second electrodes, the voltage of the control signal produced by said circuit on the sense line is approximately the same as the voltage of the control signal produced by said circuit on the sense line when no stimulus to the electric field is affecting either said first or second electrode.

23. The apparatus as claimed in claim 1 or 2 wherein said circuit produces an output signal at the output node proportional to the difference in electrical potential of the signals applied to the first and second input nodes.

24. A sensor apparatus for generating a control signal on a sense line, said apparatus comprising:
- at least one first electrode;
- at least one second electrode positioned in proximity to said first electrode;
- a strobe electrode positioned in proximity to said first and second electrodes;
- a circuit having first and second input nodes connected to said first and second electrodes, respectively, and an output node connected to the sense line;
- a signal source for providing electrical signals to said strobe electrode;
- a first resistor connected between said first electrode and said strobe electrode and a second resistor connected between said second electrode and said strobe electrode;
- wherein each of said first and second resistors has a value such that said apparatus has a relatively low input impedance compared to the impedance of a contaminant in proximity to at least one of said first and second electrodes;
- wherein an electric field is generated between said first and second electrodes in response to the signals provided to said strobe electrode by said signal source;
- wherein said first and second electrodes are arranged such that the electric field is affected by the presence of a stimulus in proximity to at least one of said first and second electrodes; and
- wherein said circuit generates a control signal on the sense line related to the difference in electrical potential between said first and second electrodes related to the electric field.

25. An apparatus according to claim 24 wherein said circuit is a differential measuring circuit in close proximity to said first and second electrodes.

26. The apparatus as claimed in claim 24 wherein the electrical signals provided by said signal source are square wave pulses.

27. The apparatus as claimed in claim 24 wherein said circuit further comprises first and second active elements.

28. The apparatus as claimed in claim 27 wherein said first and second active elements further comprise first and second transistors arranged as a differential amplifier.

29. The apparatus as claimed in claim 28 wherein the emitters of both said first and second transistors are connected to said signal source through a third resistor such that said third resistor provides negative feedback.

30. The apparatus as claimed in claim 24 further comprising an active element associated with each of said first and second electrodes.

31. The apparatus as claimed in claim 24 wherein said first and second eletrodes are mounted on a substrate comprising a dielectric material.

32. The apparatus of claim 31 wherein said circuit also is mounted on said substrate.

33. The apparatus as claimed in claim 24 wherein said circuit is mounted on a flexible material.

34. The apparatus as claimed in claim 24 wherein said circuit is located in proximity to said first and second electrodes.

35. The apparatus as claimed in claim 24 wherein said second electrode substantially surrounds said first electrode.

36. The apparatus as claimed in claim 24 wherein said first electrode is dimensioned such that said electrode may be substantially overlayed by a human appendage.

37. The apparatus as claimed in claim 24 wherein the configuration of said second electrode substantially conforms to the configuration of said first electrode and is spaced away from said first electrode.

38. The apparatus as claimed in claim 24 wherein said strobe electrode is located substantially between said first and second electrodes.

39. The apparatus as claimed in claim 24 wherein said circuit further comprises first and second active elements and said first and second resistors bias said first and second active elements, respectively, to an on state during a leading edge of at least one of said signals from said signal source.

40. The apparatus as claimed in claim 24 wherein in response to a lack of a stimulus to the electric field affecting either of said first and second electrodes, the voltage of the control signal produced by said circuit on the sense line is at a minimum.

41. The apparatus as claimed in claim 24 wherein in response to application of a stimulus to the electric field affecting said first electrode and a lack of a stimulus to the electric field affecting said second electrode, the output voltage of the control signal produced by said circuit on the sense line rises to a maximum.

42. The apparatus as claimed in claim 24 wherein in response to application of a stimulus to the electric field affecting primarily said second electrode, the voltage of the control signal produced by said circuit on the sense line is less than when no stimulus to the electric field is affecting either said first or second electrode.

43. The apparatus as claimed in claim 24 wherein in response to the application of a stimulus to the electric field having a substantially equal effect on both said first and second electrodes, the voltage of the control signal produced by said circuit on the sense line is approximately the same as the voltage of the control signal produced by said circuit on the sense line when no stimulus to the electric field is affecting either said first or second electrode.

44. The apparatus as claimed in claim 24 wherein said circuit produces an output signal at the output node proportional to the difference in electrical potential of the signals applied to the first and second input nodes.

45. A sensor apparatus for generating a control signal on a sense line, said apparatus comprising:
- at least one first electrode:
    - at least one second electrode positioned in proximity to said first electrode;
    - a circuit having first and second input nodes connected to said first and second electrodes, respectively, and an output node connected to the sense line;
    - a signal source for providing electrical signals to said first and second electrodes;
    - wherein an electric field is generated between said first and said second electrodes in response to the signals provided to at least one of said first and second electrodes by said signal source;
    - wherein said first and second electrodes are arranged such that the electric field is affected by the presence of a stimulus in proximity to at least one of said first and second electrodes;
    - wherein said circuit generates a control signal on the sense line related to the difference in electrical potential between said first and second electrodes related to the electric field; and
    - wherein in response to application of a stimulus to the electric field affecting primarily said second electrode, the voltage of the control signal produced by said circuit on the sense line is less than when no stimulus to the electric field is affecting either said first or second electrode.

46. An apparatus according to claim 45 wherein said circuit is a differential measuring circuit in close proximity to said first and second electrodes.

47. The apparatus as claimed in claim 45 wherein the electrical signals provided by said signal source are square wave pulses.

48. The apparatus as claimed in claim 45 wherein said circuit further comprises first and second active elements.

49. The apparatus as claimed in claim 48 wherein said first and second active elements further comprise first and second transistors arranged as a differential amplifier.

50. The apparatus as claimed in claim 49 wherein the emitters of both said first and second transistors are connected to said signal source through a third resistor such that said resistor provides negative feedback.

51. The apparatus as claimed in claim 45 further comprising an active element associated with each of said first and second electrodes.

52. The apparatus as claimed in claim 45 wherein said first and second electrodes are mounted on a substrate comprising a dielectric material.

53. The apparatus of claim 52 wherein said circuit also is mounted on said substrate.

54. The apparatus as claimed in claim 45 wherein said circuit is mounted on a flexible material.

55. The apparatus as claimed in claim 45 wherein said circuit is located in proximity to said first and second electrodes.

56. The apparatus as claimed in claim 45 wherein said second electrode substantially surrounds said first electrode.

57. The apparatus as claimed in claim 45 wherein said first electrode is dimensioned such that said electrode may be substantially overlayed by a human appendage.

58. The apparatus as claimed in claim 45 wherein the configuration of said second electrode substantially conforms to the configuration of said first electrode and is spaced away from said first electrode.

59. The apparatus as claimed in claim 45 wherein in response to a lack of a stimulus to the electric field affecting either of said first and second electrodes, the voltage of the control signal produced by said circuit on the sense line is at a minimum.

60. The apparatus as claimed in claim 45 wherein in response to application of a stimulus to the electric field affecting said first electrode and a lack of a stimulus to the electric field affecting said second electrode, the output voltage of the control signal produced by said circuit on the sense line rises to a maximum.

61. The apparatus as claimed in claim 45 wherein in response to the application of a stimulus to the electric field having a substantially equal effect on both said first and second electrodes, the voltage of the control signal produced by said circuit on the sense line is approximately the same as the voltage of the control signal produced by said circuit on the sense line when no stimulus to the electric field is affecting either said first or second electrode.

62. The apparatus as claimed in claim 45 wherein said circuit produces an output signal at the output node proportional to the difference in electrical potential of the signals applied to the first and second input nodes.

63. A sensor apparatus for generating a control signal on a sense line, said apparatus comprising:

at least one first electrode;

at least one second electrode positioned in proximity to said first electrode;

a strobe electrode positioned in proximity to said first and second electrodes;

a circuit having first and second input nodes connected to said first and second electrodes, respectively, and an output node connected to the sense line;

a signal source for providind electrical signals to said strobe electrode;

wherein an electric field is generated between said first and second electrodes in response to the signals provided to said strobe electrode by said signal source;

wherein said first and second electrodes are arranged such that the electric field is affected by the presence of a stimulus in proximity to at least one of said first and second electrodes; and wherein said circuit generates a control signal on the sense line related to the difference in electrical potential between said first and second electrodes related to the electric field; and wherein in response to application of a stimulus to the electric field affecting primarily said second electrode, the voltage of the control signal produced by said circuit on the sense line is less than when no stimulus to the electric field is affecting either said first or second electrode.

64. An apparatus according to claim 63 wherein said circuit is a differential measuring circuit in close proximity to said first and second electrodes.

65. The apparatus as claimed in claim 63 wherein the electrical signals provided by said signal source are square wave pulses.

66. The apparatus as claimed in claim 63 wherein said circuit further comprises first and second active elements.

67. The apparatus as claimed in claim 66 wherein said first and second active elements further comprise first and second transistors arranged as a differential amplifier.

68. The apparatus as claimed in claim 67 wherein the emitters of both said first and second transistors are connected to said signal source through a resistor such that said resistor provides negative feedback.

69. The apparatus as claimed in claim 63 further comprising an active element associated with each of said first and second electrodes.

70. The apparatus as claimed in claim 63 further comprising a first resistor connected between said first electrode and said strobe electrode and a second resistor connected between said second electrode and said strobe electrode.

71. The apparatus as claimed in claim 70 wherein each of said first and second resistors has a value such that said apparatus has a relatively low input impedance compared to the impedance of a contaminant in proximity to at least one of said first and second electrodes.

72. The apparatus as claimed in claim 70 wherein said circuit further comprises first and second active elements and said first and second resistors bias said first and second active elements, respectively, to an on state during a leading edge of at least one of said signals from said signal source.

73. The apparatus as claimed in claim 70 wherein in response to a lack of a stimulus to the electric field affecting either of said first and second electrodes, the voltage of the control signal produced by said circuit on the sense line is at a minimum.

74. The apparatus as claimed in claim 70 wherein in response to application of a stimulus to the electric field affecting said first electrode and a lack of a stimulus to the electric field affecting said second electrode, the output voltage of the control signal produced by said circuit on the sense line rises to a maximum.

75. The apparatus as claimed in claim 63 wherein said first and second electrodes are mounted on a substrate comprising a dielectric material.

76. The apparatus of claim 75 wherein said circuit also is mounted on said substrate.

77. The apparatus as claimed in claim 63 wherein said circuit is mounted on a flexible material.

78. The apparatus as claimed in claim 63 wherein said circuit is located in proximity to said first and second electrodes.

79. The apparatus as claimed in claim 63 wherein said second electrode substantially surrounds said first electrode.

80. Apparatus as claimed in claim 63 wherein said first electrode is dimensioned such that said electrode may be substantially overlayed by a human appendage.

81. The apparatus as claimed in claim 63 wherein the configuration of said second electrode substantially conforms to the configuration of said first electrode and is spaced away from said first electrode.

82. The apparatus as claimed in claim 63 wherein said strobe electrode is located substantially between said first and second electrodes.

83. The apparatus as claimed in claim 63 wherein in response to the application of a stimulus to the electric field having a substantially equal effect on both said first and second electrodes, the voltage of the control signal produced by said circuit on the sense line is approximately the same as the voltage of the control signal produced by said circuit on the sense line when no stimulus to the electric field is affecting either said first or second electrode.

84. The apparatus as claimed in claim 63 wherein said circuit produces an output signal at the output node proportional to the difference in electrical potential of the signals applied to the first and second input nodes.

\* \* \* \* \*